United States Patent [19]
Eisele et al.

[11] Patent Number: 5,471,038
[45] Date of Patent: Nov. 28, 1995

[54] SMART-DISKETTE READ/WRITE DEVICE HAVING FIXED HEAD

[75] Inventors: Raymund H. Eisele, Idstein, Germany; Paul Barrett, Worcester Park, Great Britain

[73] Assignee: Smart-Diskette GmbH, Idstein, Germany

[21] Appl. No.: 211,488

[22] PCT Filed: Oct. 1, 1992

[86] PCT No.: PCT/EP92/02272

§ 371 Date: Apr. 6, 1994

§ 102(e) Date: Apr. 6, 1994

[87] PCT Pub. No.: WO93/07555

PCT Pub. Date: Apr. 15, 1993

[30] Foreign Application Priority Data

Oct. 8, 1991 [DE] Germany ............ 41 33 246.6

[51] Int. Cl.$^6$ .................................. G06K 19/07
[52] U.S. Cl. .................. 235/380; 235/492; 235/493; 360/137
[58] Field of Search ................... 235/492, 493, 235/380, 449, 487; 360/137, 132, 133

[56] References Cited

U.S. PATENT DOCUMENTS

| | | | |
|---|---|---|---|
| 3,864,743 | 2/1975 | Staar | 360/94 |
| 3,978,524 | 8/1976 | Gordon et al. | 360/137 |
| 4,504,871 | 3/1985 | Berwick et al. | 360/31 |
| 4,701,601 | 10/1987 | Francini et al. | 235/449 |
| 4,791,283 | 12/1988 | Burkhardt | 235/438 |
| 4,797,541 | 1/1989 | Billings et al. | 235/493 |
| 5,159,182 | 10/1992 | Eisele | 235/492 |
| 5,200,600 | 4/1993 | Shinagawa | 235/492 |
| 5,212,373 | 5/1993 | Fujioka et al. | 235/492 |
| 5,237,551 | 8/1993 | Ogawa et al. | 369/54 |
| 5,338,923 | 8/1994 | Grieu | 235/492 |

FOREIGN PATENT DOCUMENTS

| | | |
|---|---|---|
| 0373411 | 6/1990 | European Pat. Off. . |
| 0437129 | 7/1991 | European Pat. Off. . |
| 4036336 | 5/1992 | Germany . |
| 90/04847 | 5/1990 | WIPO . |

OTHER PUBLICATIONS

Eric Tierling: "LAN–Kärtchen" [Small LAN Cards], vol. 6, 1993, pp. 148–150.
Peter Lippert: "Alles auf einer Karte [Everything on One Card", vol. 4, 1991, pp. 308–310 and 312.
"Computer Enzyklopädie" Hans Herbert Schulze; vol. 2, C64–Dynamo, pp. 653–654.

*Primary Examiner*—David C. Nelms
*Assistant Examiner*—Vu A. Le
*Attorney, Agent, or Firm*—Spencer, Frank & Schneider

[57] ABSTRACT

A data storage system includes a data read/write device which can be incorporated in electronic data processing (EDP) devices with the external shape of an 88.9 mm (3½ inch) diskette drive, which contains a read/write head and a controller, which transacts the protocol to write and read and is connected with a processor of the EDP device, and further includes a data carrier constructed as a smart-diskette in the shape and the dimensions of a 88.9 mm (3½ inch) diskette which can be inserted into the data read/write device. The data carrier has electronic components, including controller, microprocessor and memory as well as a stationary magnetic transducer which is firmly connected with the data carrier. Data transfers are carried out through and between the read/write head and the stationary magnetic transducer. The data read/write device has no moving parts at all, i.e., there is no drive motor for a magnetic diskette present, and the read/write head is fastened stationarily in the data read/write device, so that data exchanges between the data read/write device and the data carrier constructed as a smart-diskette are carried out only through the read/write head and the stationary magnetic transducer with the data carrier microprocessor and memory.

11 Claims, 2 Drawing Sheets

SMART-DISKETTE READ/WRITE DEVICE HAVING FIXED HEAD

BACKGROUND OF THE INVENTION

1. Field of the Invention

The invention concerns a device which can be incorporated in EDP devices.

2. Background Information

From DE-A-39 03 454 a smart-diskette is known which can be inserted into EDP devices, which diskette has a special interface in the form of an inductive transducer. This transducer is constructed in such a manner, that a data transfer between a processor situated in the diskette and the EDP device can be carried out through the read/write device which is present in the EDP device in any case. The special advantage, connected with this feature is that a data transfer between the processor of the diskette and the EDP device is feasible without additional interfaces. The construction of the transducer is known from DE-A 40 36 336.

From the WO publication 90/048 47 (Gordon) a coupling piece (coupler 6) is known, which has the external shape of a diskette. Through the coupling piece external EDP devices can be connected with a computer, which has a diskette port. The DE-A-39 03 454 as well as the WO 90/04847 documents describe the use of standard diskette ports, i.e. with a moving read/write head and a drive motor for a magnetic disc, as both publications consider it especially advantageous that both standard disks and "smart-diskettes" (DE-A-39 03 454) or the coupling piece (WO 90/04847) can be inserted in the respective diskette port.

From the U.S. Pat. No. 3,864,743 an adaptor having the external shape of a magnetic tape cassette is known, wherein the playing device is provided with a stationary reading head and plug connectors are provided for the current supply of the adaptor.

From the U.S. Pat. No. 3,978,524 a device having the external shape of a magnetic tape cassette is known, which is provided with an interface in the form of a coil. In this case the analog signals are picked up by a microphone, musical instrument or a conventional magnetic tape cassette, transmitted to the interface and transferred to the reading head of a cassette recorder through the interface.

SUMMARY OF THE INVENTION

The object of this invention is to redesign the diskette ports present in most EDP devices, which have a drive motor and moving read/write heads, in such a manner that for certain applications an improved functional value is achieved.

This object is achieved by a smart-diskette read/write device having the external shape of a standard 3½ inch diskette drive which can be incorporated into an electronic data processor (EDP), which contains a controller and a fixed non-moving read/write head, and which does not contain or require a drive motor.

A smart-diskette can be pushed into and locked in the smart-diskette read/write device. The data exchange with the transducer and the processor with the memory situated in the smart-diskette is carried out through a single firmly installed read/write head of the smart-diskette read/write device. The read/write head is connected with a controller, which transacts the protocol to write and read and is connected in turn with the processor of the EDP device. As an alternative the smart-diskette read/write device may contain a plug connector, through which the correspondingly constructed smart-diskette is supplied with current. This plug connector can also be used to charge a battery situated in a correspondingly constructed smart-diskette.

In the case of currently existing extremely flat and light EDP devices having the functions of a personal computer, described generally as a notebook or a notepad, for the purpose of saving energy the use of moving parts is avoided as far as possible. This can be achieved by using the smart-diskette read/write device. The smart-diskette can also be used for data transfer with other EDP devices which have the standard 3½ inch diskette port.

Normally, in the case of notebooks and notepads, a so called memory card is used as the storage medium in the form of an ISO card but with a thickness of approx. 3 mm. To enable data exchange with another EDP device, a corresponding read/write device has to be installed for that, into which the memory card can be inserted. A further disadvantage when using memory cards is the fact that although the user is used to deal with diskettes, the dealing with memory cards is not as widespread.

Now and then, EDP devices which are connected with a network, are installed without a disk drive for data security reasons. However, for the purpose of protecting the access to the EDP device and the network, integrated circuit cards, for example, are used with corresponding (expensive) read/write devices.

This present invention completely eliminates all disadvantages mentioned. The smart-diskette read/write device is used for notebooks/notepads. The smart-diskette read/write device can also be used in the case of other EDP devices without a conventional diskette drive. The smart-diskette read/write device cannot be used with normal diskettes; consequently the associated security problems will not arise. The protection against access to the EDP device and the network is carried out with the aid of the smart-diskette, containing the corresponding authorisations and which can also be used with other commercially available 3½ inch drives.

BRIEF DESCRIPTION OF THE DRAWINGS

Further advantages, details and the possible applications of this invention will be explained based on the embodiments shown schematically in the figures in which.

DETAILED DESCRIPTION OF THE PREFERRED EMBODIMENT(S)

Figure 1A:
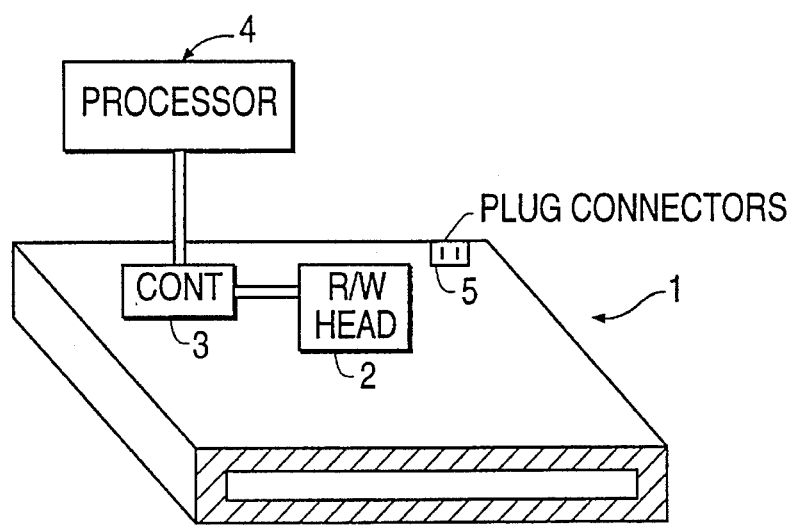
FIG. 1a a smart-diskette read/write device 1 with read/write head 2, controller 3, which is connected with the processor 4 of the EDP device and further plug connectors 5 as current interface, FIG. 1b cross section of the device according to FIG. 1a incorporated in a notebook-PC 6 with keyboard 7, monitor 8 and processor 4, FIG. 2 a smart-diskette 9 with transducer 10 assigned to the read/write head, controller 11, processor 12, memory 13, battery 14, current generator 15, current regulator 16 and alternative plug connector as current interface to the smart-diskette read/write device 1.
Figure 1B:
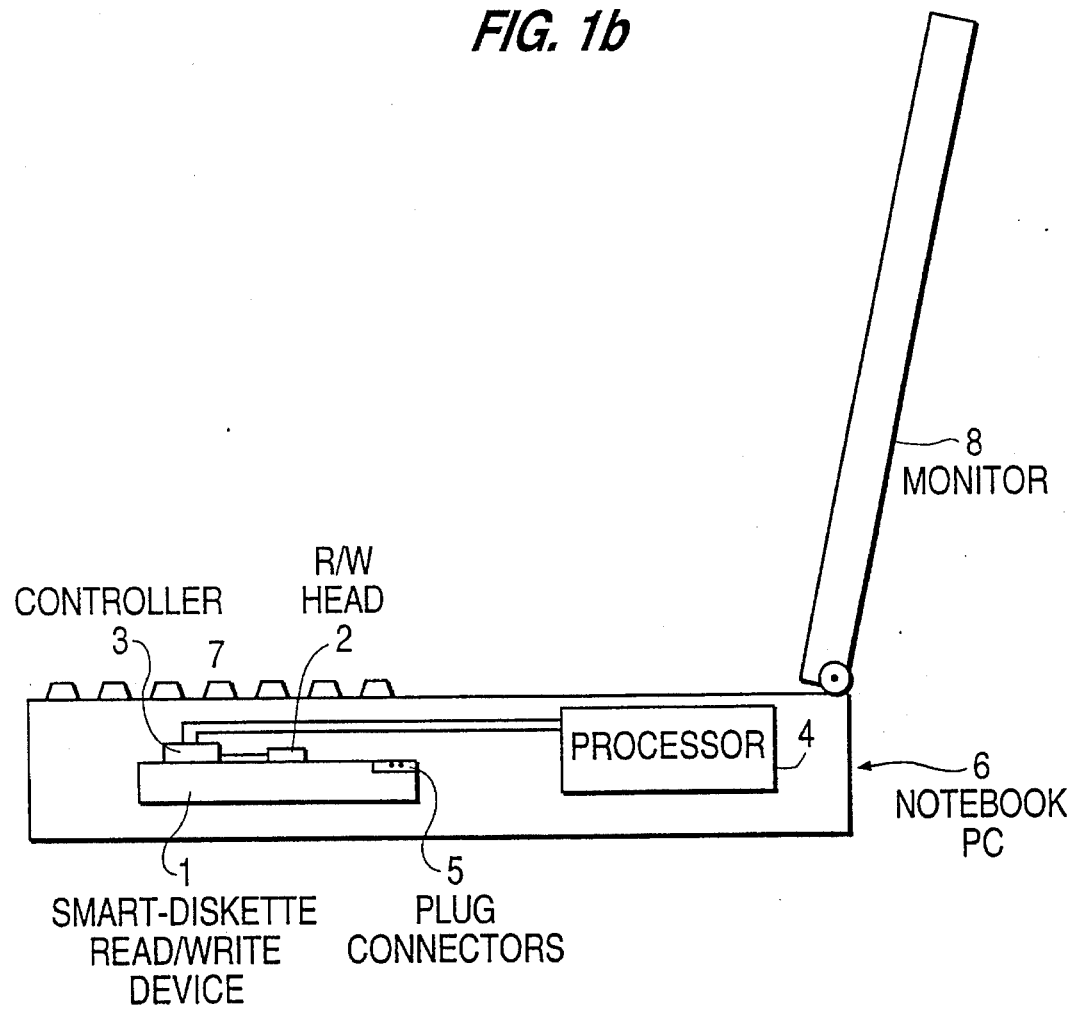

The smart-diskette read/write device 1 illustrated in FIGS. 1a and 1b includes a firmly mounted read/write head 2 as well as the controller 3, which represents the connection between the read/write head of the smart-diskette read/write device and the processor 4 of the EDP device.

Figure 2:
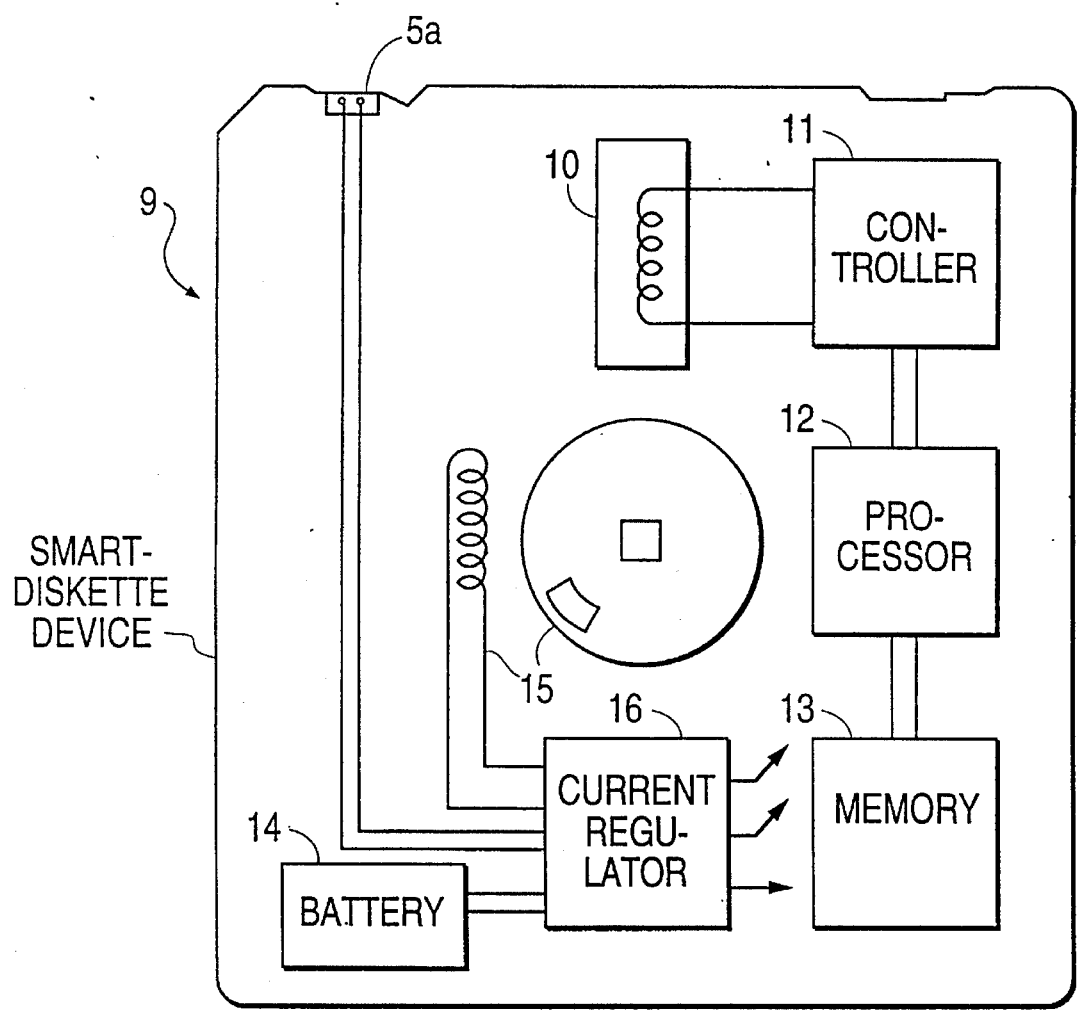

In the case of the smart-diskette illustrated in FIG. 2 one deals with a conventional smart-diskette with an additional plug connector 5a, which is used as an alternative for the current supply of the smart-diskette when it is inserted in the smart-diskette read/write device.

The plurality of possible applications of a smart-diskette read/write device becomes apparent from the following listing together with the advantages associated with it.

Possible applications/Advantages:

Read/write device for smart-diskettes with a memory of several megabytes;

It can be inserted into notebooks and notepads without moving parts;

It can be inserted into conventional EDP devices, in which a 3½ inch drive must not be installed due to security reasons (the read/write device can be used with smart-diskettes, but not with conventional diskettes);

Simple data exchange with smart-diskettes between conventional 3½ inch drives and notebooks/notepads without moving parts;

Higher data flow rate (up to 500 kbit/sec).

What is claimed is:

1. A data storage system comprising:

a data read/write device which can be incorporated in electronic data processing (EDP) devices with the external shape of a 88.9 mm (3½) inch diskette drive, which contains a read/write head and a controller, which transacts the protocol to write and read and is connected with a processor of the EDP device, and a data carrier constructed as as smart-diskette in the shape and the dimensions of a 88.9 mm (3½ inch) diskette which can be inserted into the data read/write device, which data carrier therefore has electronic components, including controller, microprocessor and memory as well as a stationary magnetic transducer which is firmly connected with the data carrier, wherein data transfers are carried out through and between the read/write head and the stationary magnetic transducer, and wherein the data read/write device has no moving parts at all, i.e., there is no drive motor for a magnetic diskette present, and the read/write head is fastened stationarily in the data read/write device, so that data exchanges between the data read/write device and the data carrier constructed as a smart-diskette are carried out only through the read/write head and the stationary magnetic transducer with the data carrier microprocessor and memory.

2. The data storage system according to claim 1, wherein a plug connector is situated in the data read/write device, for supplying current for the electronic components of the data carrier constructed as a smart-diskette.

3. The data storage system according to claim 1, wherein conventional diskettes cannot be used with the data read/write device, the data read/write device thereby providing access security for an associated EDP device.

4. The data storage system according to claim 1, wherein data exchanges between the data read/write device and the data carrier constructed as a smart-diskette are at a rate up to approximately 500 kbits per second.

5. The data storage system according to claim 2, wherein the data carrier constructed as a smart-diskette includes a battery which is charged by the current supplied by the plug connector of the data read/write device.

6. A data storage device for use in electronic data processing equipment having a processor therein including note-book personal computers, the data storage device for receiving a smart-diskette data carrier therein and facilitating an exchange of data between the electronic data processing equipment processor and the smart-diskette data carrier, the smart-diskette data carrier having a stationary magnetic transducer, a microprocessor and memory thereon, the data storage device comprising:

a frame having the shape of a diskette drive for incorporation into associated electronic data processing equipment, and for receiving a smart-diskette therein;

a fixed non-moving read/write head for effecting data transfers with the stationary magnetic transducer of a smart-diskette data carrier received in the data storage device; and controller means for controlling data transfers between the fixed non-moving read/write head of the data storage device and the stationary magnetic transducer of a smart-diskette data carrier received in the data storage device.

7. The data storage device according to claim 6, wherein the frame having the shape of a diskette drive has the shape of a 3½ inch diskette drive.

8. The data storage device according to claim 6, wherein the controller means interfaces the data storage device with the processor of electronic data processing equipment in which the data storage device is incorporated.

9. The data storage device according to claim 6, further comprising plug connection means for providing power to a smart-diskette data carrier from electronic data processing equipment in which the data storage device is incorporated.

10. The data storage device according to claim 7, wherein the data storage device does not include any diskette driving means, wherein the frame having the shape of a 3½ inch diskette drive can receive a standard 3½ inch diskette therein, and wherein, because the data storage device has a fixed non-moving read/write head and does not have any diskette driving means, the data storage device will not operate with a standard 3½ inch diskette and will only operate with a smart-diskette data carrier.

11. The data storage device according to claim 7, wherein the electronic data processing equipment in which the storage device is incorporated is part of a network of electronic data processing equipment and does not include a standard diskette drive for security reasons, wherein the smart-diskette data carrier contains necessary authorization data for accessing the electronic data processing equipment, and wherein the data storage device together with the smart-diskette data carrier thereby provide for access security to the electronic data processing equipment.

* * * * *